(12) United States Patent
Zhang et al.

(10) Patent No.: US 12,027,846 B2
(45) Date of Patent: Jul. 2, 2024

(54) ELECTROSTATIC PROTECTION STRUCTURE AND ELECTROSTATIC PROTECTION CIRCUIT

(71) Applicant: ChangXin Memory Technologies, Inc., Hefei (CN)

(72) Inventors: Yingtao Zhang, Hefei (CN); Pan Mao, Hefei (CN); Junjie Liu, Hefei (CN); Lingxin Zhu, Hefei (CN); Bin Song, Hefei (CN); Qian Xu, Hefei (CN); Tieh-Chiang Wu, Hefei (CN)

(73) Assignee: ChangXin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/790,462

(22) PCT Filed: Mar. 23, 2022

(86) PCT No.: PCT/CN2022/082409
§ 371 (c)(1),
(2) Date: Jun. 30, 2022

(87) PCT Pub. No.: WO2023/130589
PCT Pub. Date: Jul. 13, 2023

(65) Prior Publication Data
US 2024/0170952 A1 May 23, 2024

(30) Foreign Application Priority Data

Jan. 10, 2022 (CN) .......................... 202210021740.8

(51) Int. Cl.
*H02H 9/02* (2006.01)
*H01L 27/02* (2006.01)

(52) U.S. Cl.
CPC ........... *H02H 9/02* (2013.01); *H01L 27/0255* (2013.01); *H01L 27/0262* (2013.01); *H01L 27/0266* (2013.01); *H01L 27/0292* (2013.01)

(58) Field of Classification Search
CPC ... H02H 9/02; H01L 27/0255; H01L 27/0262; H01L 27/0266; H01L 27/0292
(Continued)

(56) References Cited

U.S. PATENT DOCUMENTS

| 2003/0038298 | A1* | 2/2003 | Cheng | ................ | H01L 27/0262 |
| | | | | | 257/107 |
| 2016/0056147 | A1 | 2/2016 | Li et al. | | |
| 2016/0372455 | A1* | 12/2016 | Zhong | .................. | H01L 29/083 |

FOREIGN PATENT DOCUMENTS

| CN | 101764150 A | 6/2010 |
| CN | 103606548 A | 2/2014 |

(Continued)

OTHER PUBLICATIONS

Machine translation of Liu et al. Chinese Patent Document CN 105609488 A May 2016 (Year: 2016).*
Machine translation of Du et al. Chinese Patent Document CN 110047921 A Jul. 2019 (Year: 2019).*
Machine translation of Gan Chinese Patent Document CN 104716132 A Jun. 2015 (Year: 2015).*
PCT/CN2022/082409 International Search Report mailed Sep. 20, 2022.

*Primary Examiner* — Kevin J Comber
(74) *Attorney, Agent, or Firm* — Kilpatrick Townsend & Stockton LLP (57) ABSTRACT

Embodiments of the present disclosure relate to an electrostatic protection structure and an electrostatic protection circuit. The electrostatic protection structure includes: a SCR structure and a trigger structure; the SCR structure includes: a well region of a second conductivity type and a first well of a first conductivity type region, a first-doped region of the first conductivity type, and a first-doped region of the second conductivity type; the trigger structure includes: a first-doped region of the second conductivity type, a second well region of the first conductivity type, a (Continued)

second-doped region of two conductivity types, a third-doped region of the second conductivity type, a fourth-doped region of the second conductivity type, and a first gate electrode. The electrostatic protection structure weakens the positive feedback of the parasitic transistor in the SCR device, improves the anti-latch capability of the device, realizes stronger protection capability, and enhances the reliability of the circuit.

16 Claims, 5 Drawing Sheets

(58) Field of Classification Search
USPC .................................................. 361/93.1, 56
See application file for complete search history.

(56) References Cited

FOREIGN PATENT DOCUMENTS

| CN | 104716132 | A | * | 6/2015 | |
|----|-----------|---|---|--------|---|
| CN | 104716132 | A |   | 6/2015 | |
| CN | 105609488 | A | * | 5/2016 | ............ H01L 23/60 |
| CN | 107452735 | A |   | 12/2017 | |
| CN | 105609488 |   |   | 7/2018 | |
| CN | 110047921 | A | * | 7/2019 | |
| CN | 110047921 | A |   | 7/2019 | |
| CN | 110491875 | A |   | 11/2019 | |

* cited by examiner

ELECTROSTATIC PROTECTION STRUCTURE AND ELECTROSTATIC PROTECTION CIRCUIT

CROSS REFERENCE

This application claims the priority to Chinese patent application No. 202210021740.8, filed on Jan. 10, 2022, and entitled "Electrostatic Protection Structure and Electrostatic Protection Circuit", the disclosure of which is incorporated herein by reference in entirety.

TECHNICAL FIELD

The embodiments of the present disclosure relate to the field of semiconductor technology, and in particular, to an electrostatic protection structure and an electrostatic protection circuit.

BACKGROUND

At present, the reliability of chip design is a major issue in the chip design process. The value of chips damaged by static electricity every year runs as high as tens of billions of dollars, and more than 70% of the damage is from ESD (Electro-Static Discharge) events, therefore, in chip design, the protection of electrostatic discharge events is particularly important.

However, the traditional ESD protection function is too simple, and it is difficult to effectively protect against ultra-high electrostatic voltage. SCR (Silicon Controlled Rectifier) devices have many advantages such as high robustness, small parasitic capacitance and layout area savings, so they have attracted much attention, and is expected to become the most suitable ESD protection device in the future. However, traditional SCR devices have high trigger voltage and low sustain voltage, which easily makes the ESD protection circuit difficult to turn on when the ESD shock arrives, and difficult to turn off after the ESD shock is over. In view of these shortcomings, many experts have made improvements to the basic SCR structures. However, the existing improved SCR structures can only optimize the trigger voltage of the traditional SCR device, but has little effect on the phenomenon of low sustain voltage after the SCR device is turned on, whereas the low sustain voltage is prone to latch-up phenomenon, and after the ESD event ends, it will greatly interfere with the entire working circuit, making the normal operation of the circuit impossible.

SUMMARY

In various embodiments according to the present disclosure, an electrostatic protection structure and an electrostatic protection circuit are provided.

According to one embodiment of the present disclosure provides an electrostatic protection structure, including:
a silicon controlled rectifier structure which includes: a well region of a second conductivity type; a first well region of a first conductivity type adjacent to the well region of the second conductivity type; a first-doped region of the first conductivity type, in the well region of the second conductivity type; a first-doped region of the second conductivity type in the first well region of the first conductivity type; and
a trigger structure which includes: a first-doped region of the second conductivity type; a second well region of the first conductivity type, which is located in the well region of the second conductivity type on the one side away from the first well region of the first conductivity type and is adjacent to the well region of the second conductivity type; the second-doped region of the second conductivity type is located in the second well region of the first conductivity type; a third-doped region adjacent to the first-doped region of the first conductivity type and extending from the well region of the second conductivity type to the first well region of the first conductivity type; a fourth-doped region of the second conductivity type extends from the well region of the second conductivity type to the second well region of the first conductivity type; and a first gate is located between the third-doped region of the second conductivity type and the first doped-region of the second conductivity type.

According to some embodiments, a second-doped region of a first conductivity type is further included, located in the first well region of the first conductivity type and in the third-doped region of the first conductivity type and on the one side away from of the first gate.

According to some embodiments, the second well region of the first conductivity type, the second-doped region of the second conductivity type, and the fourth-doped region of the second conductivity type constitute a first transistor, the first gate, the first-doped region of the second conductivity type, the third-doped region of the second conductivity type, and the first well region of the first conductivity type constitute a first switch transistor.

According to some embodiments, the first-doped region of the first conductivity type and the third-doped region of the second conductivity type form a diode, and the diode and the first switch transistor form a leakage path.

According to some embodiments, the well region of the second conductivity type, the first well region of the first conductivity type, and the first-doped region of the second conductivity type constitute a second transistor; the second well region of the conductivity type, the first-doped region of the first conductivity type, and the first well region of the first conductivity type constitute a third transistor.

According to some embodiments, a substrate of a first conductivity type is further included; the first well region of the first conductivity type, the well region of the second conductivity type, and the second well region of the first conductivity type are all located in inside the substrate of the first conductivity type; and the first gate is located on the surface of the substrate of the first conductivity type.

According to some embodiments, a second gate is further included, located on the surface of the substrate of the first conductivity type, also located between the second-doped region of the second conductivity type and the fourth-doped region of the second conductivity type regions; herein the second gate, the second-doped region of the second conductivity type, the fourth-doped region of the second conductivity type, and the second well region of the first conductivity type constitute the second switch transistor.

According to some embodiments, the first-doped region of the first conductivity type, the well region of the second conductivity type, and the first well region of the first conductivity type constitute a PNP transistor; the well region of the second conductivity type, the first well region of the first conductivity type and the first-doped region of the second conductivity type constitute an NPN transistor; the fourth-doped region of the second conductivity type, the second well region of the first conductivity type, and the second-doped region of the second conductivity type constitute an NPC transistor; the first gate, the first-doped region of the second conductivity type and the third-doped region of the second conductivity type constitutes the first switch transistor, the second gate, the second-doped region of the second conductivity type and the fourth-doped region of the second conductivity type constitute the second switch transistor; the first-doped region of the first conductivity type and the third-doped region of the second conductivity type constitute a diode.

According to some embodiments, the width of the third-doped region of the second conductivity type and the width of the fourth-doped region of the second conductivity type are both two times the width of the first-doped region of the second conductivity type, and also two times the width of the second-doped region of the second conductivity type.

According to some embodiments, the first conductivity type includes P-type and the second conductivity type includes N-type.

According to some embodiments, another embodiment of the present disclosure discloses an electrostatic protection circuit, comprising:
- a SCR circuit which includes a first end, a second end, a third end, a fourth end and a fifth end; the first end of the SCR circuit is connected to the anode voltage; the fourth end of the SCR circuit is connected to the cathode voltage; and
- a trigger circuit includes a first transistor and a first switch; wherein, the first transistor includes a first end, a second end and a third end, and the first switch includes a control end and a first end and the second end; the first end of the first transistor is connected to the anode voltage, and the second end of the first transistor is connected to the second end of the SCR circuit, so the third end of the first transistor is connected to the fifth end of the SCR circuit; the control end of the first switch is connected to the third end of the first transistor and the controllable SCR. The fifth end of the SCR circuit is connected, the first end of the first switch transistor is connected to the third end of the SCR circuit, and the second end of the first switch transistor is connected to the cathode voltage.

According to some embodiments, the SCR circuit includes a second transistor and a third transistor; wherein the second transistor includes a first end, a second end and a third end, the third The transistor includes a first end, a second end and a third end. The first end of the second transistor and the second end of the third transistor are short-circuited and together become as the third end of the SCR circuit, the second end of the second transistor is the fifth end of the SCR circuit, and the third end of the second transistor is the fourth end of the SCR circuit; the first end of the third transistor is the first end of the SCR circuit, and the third end of the third transistor is the second end of the SCR circuit.

According to some embodiments, the base of the third transistor and the drain of the first switch transistor form a diode, the diode and the first switch transistor form a bleeder circuit, and the anode of the diode and the emitter of the third transistor are connected to the anode voltage, and the first end of the first switch is connected to the cathode of the diode.

According to some embodiments, the first transistor is an NPN transistor, the collector of the first transistor is the first end of the first transistor, and the base of the first transistor is the second end of the first transistor, the emitter of the first transistor is the third end of the first transistor; the second transistor is an NPN type transistor, the collector of the second transistor is the first end of the second transistor, the base of the second transistor is the second end of the second transistor, and the emitter of the second transistor is the third end of the second transistor, the third transistor is a PNP type transistor, the emitter of the third transistor is the first end of the third transistor, the base of the third transistor is the second end of the third transistor, and the collector of the third transistor is the third end of the third transistor.

According to some embodiments, the first switch transistor includes an NMOS transistor, the drain of the first switch transistor is the first end of the first switch transistor, and the gate of the first switch transistor is the first switch transistor, the source of the first switch transistor is the second end of the first switch transistor.

According to some embodiments, it also includes:
- a first parasitic resistor, one end is connected to the second end of the SCR circuit, and the other end is connected to the cathode voltage;
- a second parasitic resistor, one end of which is connected to the fifth end of the SCR circuit, the third end of the first transistor and the control end of the first switch transistor are connected, and the other end is connected to the cathode voltage;
- The third parasitic resistor has one end connected to the first end of the first transistor, the first end of the first switch transistor and the third end of the SCR circuit, and the other end connected to the anode voltage.

Embodiments of the embodiments of the present disclosure may/at least have the following advantages:

When the ESD event comes, the above electrostatic protection circuit first breaks down the transistor composed of the fourth-doped region of the second conductivity type, the second well region of the first conductivity type, and the second-doped region of the second conductivity type, and passes through the second-doped region of the second conductivity type, the third-doped region of the first conductivity type, and the second-doped region of the first conductivity type to reach the cathode, therefore, the trigger voltage becomes lower. And at the same time a voltage drop occurs in the first well region of the first conductivity type, which turns on the SCR structure. After the SCR structure is turned on, a voltage drop occurs on the gate (i.e., the first gate) of the first-doped region of the second conductivity type, the switches corresponding to the first gate, the first-doped region of the second conductivity type, the third-doped region of the second conductivity type, and the first well region of the first conductivity type are turned on, thereby turning on the newly added drain. The current divider path weakens the positive feedback of the SCR structure, thus the sustaining voltage becomes higher, thereby enhancing its latch-up resistance.

When the ESD event comes, the above electrostatic protection circuit first breaks down the first transistor, and the current reaches the cathode, so the trigger voltage becomes lower. After the SCR circuit is turned on, because of the voltage drop on the gate of the first switch transistor, the first switch transistor is turned on, which in turn conducts the new leakage and voltage divider path, which weakens the positive feedback of the SCR circuit, so the sustaining voltage becomes higher, enhancing its latch-up resistance.

The details of one or more embodiments of the disclosed embodiments are set forth in the accompanying drawings and the description below. Other features, objects, and advantages of embodiments of the present disclosure will become apparent from the description, drawings, and claims.

BRIEF DESCRIPTION OF THE DRAWINGS

To illustrate the technical solutions in the embodiments of the present disclosure more clearly, the following accompanying drawings are briefly introduced. The accompanying drawings are only some embodiments. For those of ordinary skill in the art, other drawings can also be obtained according to these drawings without creative efforts.

DETAILED DESCRIPTION OF THE PREFERRED EMBODIMENTS

In order to facilitate the understanding of the embodiments of the present disclosure, a more comprehensive description of the embodiments of the present disclosure will be made below with reference to the related drawings. Examples of embodiments of the present disclosure are presented in the accompanying drawings. However, embodiments of the present disclosure may be implemented in many different forms and are not limited to the embodiments described herein. Rather, these embodiments are provided so that this disclosure will be thorough and complete.

Unless otherwise defined, all technical and scientific terms used herein have the same meaning as commonly understood by one of ordinary skill in the art to which the embodiments of the present disclosure belong. The terms used herein in the description of the embodiments of the present disclosure are only for the purpose of describing specific embodiments, and are not intended to limit the embodiments of the present disclosure.

It will be understood that the terms "first", "second" and the like used in the embodiments of the present disclosure may be used herein to describe various elements, but these elements are not limited by these terms. These terms are only used to distinguish a first element from another element. For example, without departing from the scope of the disclosed embodiments, the first power input could be referred to as the second power input, and similarly, the second power input could be referred to as the first power input. Both the first power input terminal and the second power input terminal are power input terminals, but they are not the same power input terminal.

It can be understood that the "connection" in the following embodiments should be understood as "electrical connection", "communication connection", etc. if the connected circuits, modules, units, etc. have electrical signals or data transmission between them.

As used herein, the singular forms "a," "an," and "the/the" can include the plural forms as well, unless the context clearly dictates otherwise. It should also be understood that the terms "comprising/comprising" or "having" etc. designate the presence of stated features, integers, steps, operations, components, parts or combinations thereof, but do not preclude the presence or addition of one or more Possibilities of other features, integers, steps, operations, components, parts or combinations thereof.

Figure 1:
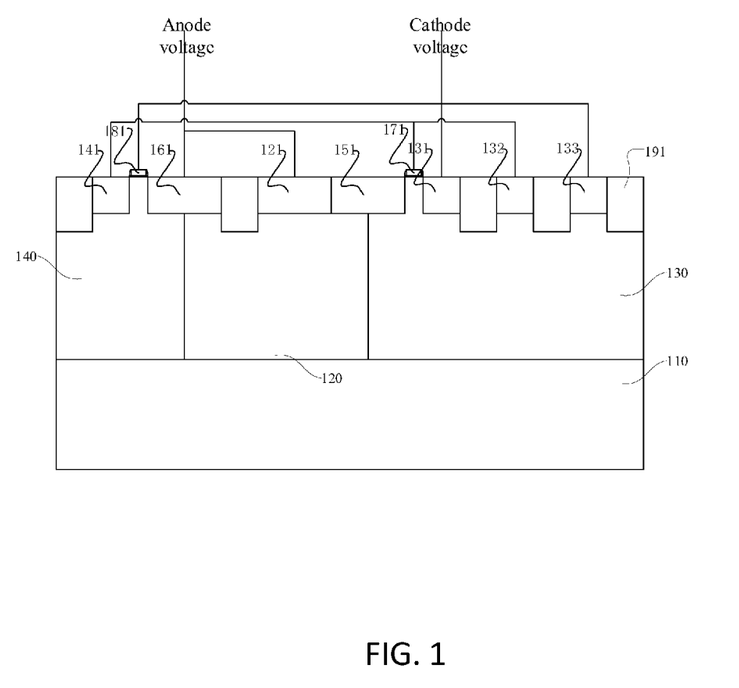
FIG. 1 is the schematic cross-sectional view of an electrostatic protection structure provided according to an embodiment of the present disclosure.

Referring to FIG. 1, in an embodiment of the present disclosure, an electrostatic protection structure is provided. The electrostatic protection structure includes: a SCR structure, and the SCR structure includes: a well region 120 of the second conductivity type; the first well region 130 of the first conductivity type is adjacent to the well region 120 of the second conductivity type; the first-doped region 121 of the first conductivity type is of the first conductivity type; the first-doped region 121 is located in the well region 120 of the second conductivity type; the first-doped region 131 of the second conductivity type, and the first-doped region 131 of the second conductivity type is located in the first well region of the first conductivity type 130; trigger structure, the trigger structure includes: a first-doped region 131 of the second conductivity type; a second well region 140 of the first conductivity type, the second well region 140 of the first conductivity type is located in the well of the second conductivity type; the region 120 is far from one side of the first well region 130 of the first conductivity type, and is adjacent to the well region 120 of the second conductivity type; the second-doped region 141 of the second conductivity type, the second-doped region of the second conductivity type; the-doped region 141 is located in the second well region 140 of the first conductivity type; the third-doped region 151 of the second conductivity type, the third-doped region 151 of the second conductivity type and the first-doped region of the first conductivity type; the region 121 is adjacent and extends from the well region 120 of the second conductivity type into the first well region 130 of the first conductivity type; the fourth-doped region 161 of the second conductivity type, the fourth-doped region of the second conductivity type; the impurity region 161 extends from the well region 120 of the second conductivity type to the second well region 140 of the first conductivity type; the first gate 171 is located between the third-doped region 151 of the second conductivity type and the first-doped regions 131 of the second conductivity type.

The electrostatic protection structure further includes a second-doped region 133 of the first conductivity type, the second-doped region 133 of the first conductivity type is located in the first well region 130 of the first conductivity type, and is located in the third-doped region of the first conductivity type, the-doped region 132 is away from the side of the first gate electrode 171.

When the ESD event comes, the above electrostatic protection structure first breaks down the transistor composed of the fourth-doped region 161 of the second conductivity type, the second well region 140 of the first conductivity type and the second-doped region 141 of the second conductivity type, and reach the cathode through the second-doped region 141 of the second conductivity type, the third-doped region 132 of the first conductivity type, and the second-doped region 133 of the first conductivity type, so the trigger voltage becomes lower, and at the same time the first well region 130 of the first conductivity type will generate a voltage drop to turn on the SCR structure. After the SCR structure is turned on, because the gate of the first-doped region 131 of the second conductivity type (i.e. the first gate A voltage drop is generated on the electrode 171), the first-doped region 131 of the second conductivity type, the first gate 171, the third-doped region 151 of the second conductivity type, and the first well region 130 of the first conductivity type correspond to the switch transistor is turned on, which in turn conducts the new leakage and voltage divider path, which weakens the positive feedback of the SCR structure, so that the holding voltage becomes higher and its anti-latch capability is enhanced.

As an example, the electrostatic protection structure further includes the substrate 110 of the first conductivity type; the first well region 130 of the first conductivity type, the well region 120 of the second conductivity type and the second well region 140 of the first conductivity type are all located in the Inside the substrate 110 of a conductivity type; the first gate electrode 171 is located on the surface of the substrate 110 of the first conductivity type.

Specifically, the substrate 110 of the first conductivity type may include, but is not limited to, a silicon substrate of the first conductivity type or a germanium substrate of the first conductivity type.

As an example, the electrostatic protection structure further includes a second gate 181, the second gate 181 is located on the surface of the substrate 110 of the first conductivity type, and is located between the second-doped region 141 of the second conductivity type and the second-doped region 141 of the second conductivity type, between the four-doped regions 161. The function of the second gate 181 is to make the breakdown point of the transistor fixed near the channel by grounding, thereby reducing the breakdown voltage.

As an example, the first-doped region 121 of the first conductivity type, the second-doped region 133 of the first conductivity type, the third-doped region 132 of the first conductivity type, the first-doped region 131 of the second conductivity type, the second-doped region 141 of the second conductivity type, the third-doped region 151 of the second conductivity type, and the fourth-doped region 161 of the second conductivity type may all be heavily-doped regions; the well region 130, the second well region 140 of the first conductivity type and the well region 120 of the second conductivity type may all be lightly-doped regions.

As an example, the electrostatic protection structure further includes a plurality of shallow trench isolation structures 191, and the plurality of shallow trench isolation structures 191 are respectively located in the second-doped region 133 of the first conductivity type and the third-doped region 132 of the first conductivity type between the third doping region 132 of the first conductivity type and the first doping region 131 of the second conductivity type, the first doping region 121 of the first conductivity type and the fourth doping region 121 of the second conductivity type between the regions 161, outside the second-doped region 133 of the first conductivity type, and outside the second-doped region 141 of the second conductivity type.

Specifically, the longitudinal cross-section of the shallow trench isolation structure 191 may be a rectangle, an inverted trapezoid or a semi-ellipse, etc. The bottom of the shallow trench isolation structure 191 is lower than the bottom of the first-doped region 121 of the first conductivity type, the bottom of the second-doped region 133 of the first conductivity type, the bottom of the third-doped region 132 of the first conductivity type, the bottom of the first-doped region 131 of the second conductivity type, the second-doped region of the second conductivity type The bottom of the impurity region 141, the bottom of the third-doped region 151 of the second conductivity type, and the bottom of the fourth-doped region 161 of the second conductivity type, and the bottom of the shallow trench isolation structure 191 is higher than that of the second conductivity type; the bottom of the well region 120, the bottom of the first well region 130 of the first conductivity type, and the bottom of the second well region 140 of the first conductivity type. That is, the depth of the first-doped region 121 of the first conductivity type, the depth of the second-doped region 133 of the first conductivity type, the depth of the third-doped region 132 of the first conductivity type, the depth of the first-doped region 132 of the second conductivity type, the depth of the d-doped region 131, the depth of the second-doped region 141 of the second conductivity type, the depth of the third-doped region 151 of the second conductivity type, and the depth of the fourth-doped region 161 of the second conductivity type are all less than the depth of the shallow trench isolation structure 191.

As an example, the first-doped region 121 of the first conductivity type and the fourth-doped region 161 of the second conductivity type are electrically connected to the anode voltage; the second gate 181, the second-doped region 133 of the first conductivity type and the first-doped region 131 of the two conductivity types is connected to the cathode voltage. The function of the second gate 181 is to make the breakdown point of the transistor fixed near the channel by grounding, thereby reducing the breakdown voltage.

In one example, the fourth-doped region 161 of the second conductivity type is connected to the first-doped region 121 of the first conductivity type via a metal wire; the first gate 171 is connected to the third-doped region of the first conductivity type; the region 132 and the second-doped region 141 of the second conductivity type are connected via metal lines; the second gate 181 is connected to the second-doped region 133 of the first conductivity type and the first-doped region 131 of the second conductivity type via Metal wires are connected. Specifically, the metal wire may include but not limited to copper wire, aluminum wire, gold wire, nickel wire, etc. In this embodiment, the metal wire may be copper wire.

As an example, the width of the third-doped region 151 of the second conductivity type and the width of the fourth-doped region 161 of the second conductivity type can be set according to actual needs. Specifically, the third-doped region of the second conductivity type; the width of the region 151 and the width of the fourth-doped region 161 of the second conductivity type may both be twice the width of the first-doped region 131 of the second conductivity type and the width of the second-doped region 141 of the second conductivity type. Twice the width can ensure that the anode voltage and the cathode voltage are evenly applied to the corresponding-doped regions, and ensure the balance of the voltage difference in the entire-doped region; meanwhile, it is also convenient for the implementation of the process and the symmetry of the device.

As an example, the first conductivity type may include a P-type, and the second conductivity type may include an N-type. Of course, in other examples, the first conductivity type may also include N-type, and the second conductivity type may include P-type.

Specifically, for example, the first conductivity type may include P type, and the second conductivity type may include N type, the first-doped region 121 of the first conductivity type, the well region 120 of the second conductivity type, and the first conductivity type of the first well region 130 constitutes a PNP transistor (i.e. the third transistor); the well region 120 of the second conductivity type, the first well region 130 of the first conductivity type and the first-doped region 131 of the second conductivity type The first NPN transistor (i.e. the second transistor) is formed; the fourth-doped region 161 of the second conductivity type, the second well region 140 of the first conductivity type and the second-doped region 141 of the second conductivity type are formed The second NPN transistor (ie, the first transistor); the first gate 171, the first-doped region 131 of the second conductivity type and the third-doped region 151 of the second conductivity type constitute a first switch transistor;

The second gate 181, the second-doped region 141 of the second conductivity type and the fourth-doped region 161 of the second conductivity type constitute a second switch transistor.

As an example, the first-doped region 121 of the first conductivity type and the third-doped region 151 of the second conductivity type constitute a diode. The diode formed by the first-doped region 121 of the first conductivity type and the third-doped region 151 of the second conductivity type may be a Zener diode.

Figure 2:
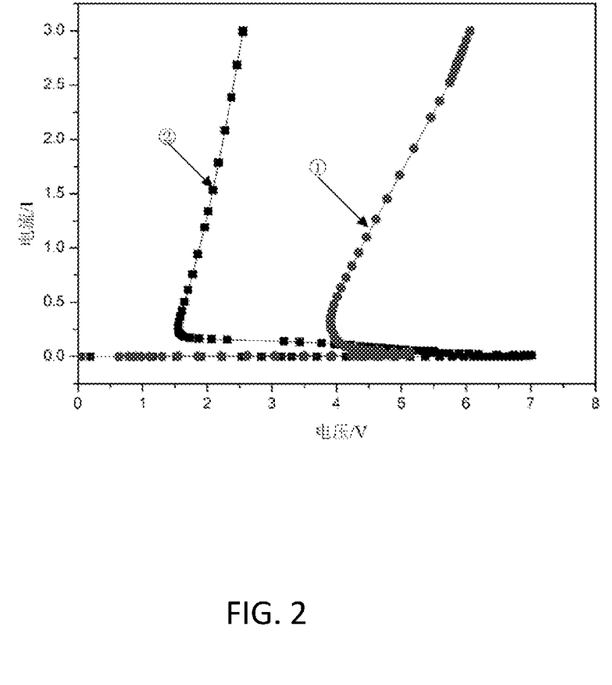
FIG. 2 is the current-voltage simulation curve of the electrostatic protection structure according to an embodiment of the disclosure and the current-voltage curve of the conventional silicon-controlled rectifier device; wherein, curve ① in FIG. 2 is the current-voltage simulation curve of the electrostatic protection structure according to the embodiment of the disclosure, curve ② in FIG. 2 is the current-voltage curve of the traditional silicon-controlled rectifier device.

Similarly, taking the first conductivity type including P-type and the second conductivity type including N-type as an example, in this embodiment of the present disclosure, the-doped region 121 is directly connected to the drain 151 of the first switch transistor to form a diode and an NMOS. The connected leakage path can effectively weaken the positive feedback of the SCR device and increase the holding voltage of the entire electrostatic protection structure. In this way, when the ESD strikes, when the SCR path is turned on, there is a diode connected in series. A leakage circuit of a switch transistor, and the existence of this path makes the holding voltage of the electrostatic protection structure significantly higher than that of traditional devices, and the anti-latch capability of the entire electrostatic protection structure is greatly increased. Specifically, the fourth-doped region 161 of the second conductivity type, the second well region 140 of the first conductivity type, and the second-doped region 141 of the second conductivity type constitute a second NPN transistor, and the second conductivity type; the three-doped region 161 is connected to the anode voltage as the collector of the second NPN transistor, and the second-doped region 141 of the second conductivity type in the second NPN transistor is the source of the second switch transistor, connected to the first gate 171 and the third-doped region 132 of the first conductivity type, the second gate 181 is connected to the second-doped region 133 of the first conductivity type, and at the same time, connected to the anode voltage; the first-doped region 121 of the first conductivity type is also directly connected to the drain 151 of the first switch transistor to form a leakage path connecting the PN junction and the NMOS; when the ESD event comes, the second conductivity type is first broken down. A transistor composed of the fourth-doped region 161, the second well region 140 of the first conductivity type, and the second-doped region 141 of the second conductivity type, and the second-doped region 141 of the second conductivity type, the third-doped region 132 of the first conductivity type and the second-doped region 133 of the first conductivity type reach the cathode, so the trigger voltage becomes lower, and at the same time, a voltage drop occurs in the first well region 130 of the first conductivity type, and the turn-on can be performed. Silicon controlled structure, after the silicon controlled structure is turned on, due to the voltage drop on the first gate 171, the first-doped region 131 of the second conductivity type, the third-doped region 151 of the second conductivity type, the first gate of the switch transistor corresponding to the pole 171 and the first well region of the first conductivity type is turned on, thereby turning on the new leakage current divider path, weakening the positive feedback of the SCR structure, so the holding voltage becomes higher and its anti-latch resistance is enhanced, lock ability. The current-voltage simulation curve of the electrostatic protection structure of the embodiment of the present disclosure and the conventional silicon controlled rectifier device is shown in FIG. 2. The current-voltage simulation curve of the electrostatic protection structure of the embodiment of the present disclosure is No. 1, and the current-voltage simulation curve of the traditional silicon controlled rectifier device is No. 2. It can be seen that the trigger voltage of the electrostatic protection structure of the embodiment of the present disclosure is about is 5.2V, the trigger voltage of the traditional silicon controlled rectifier device is about 7V, and the trigger voltage is significantly reduced; the holding voltage of the electrostatic protection structure of the embodiment of the present disclosure is about 4V, and the holding voltage of the traditional silicon controlled rectifier device is about 1.5V, the sustain voltage is significantly increased.

Figure 3:
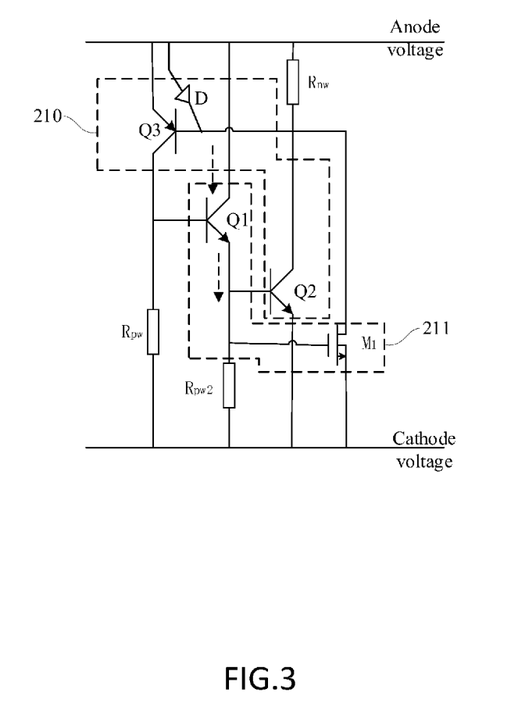
FIGS. 3 to 5 are circuit schematic diagrams of electrostatic protection circuits provided according to another embodiment of the present disclosure.
Figure 4:
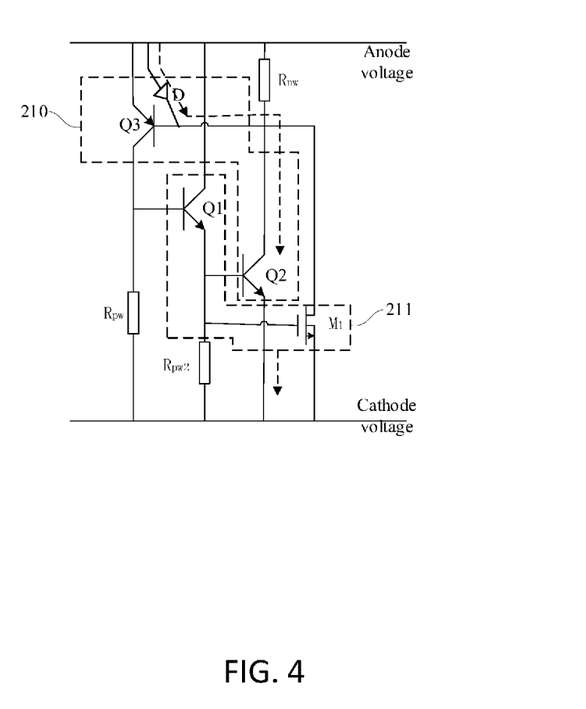
Figure 5:
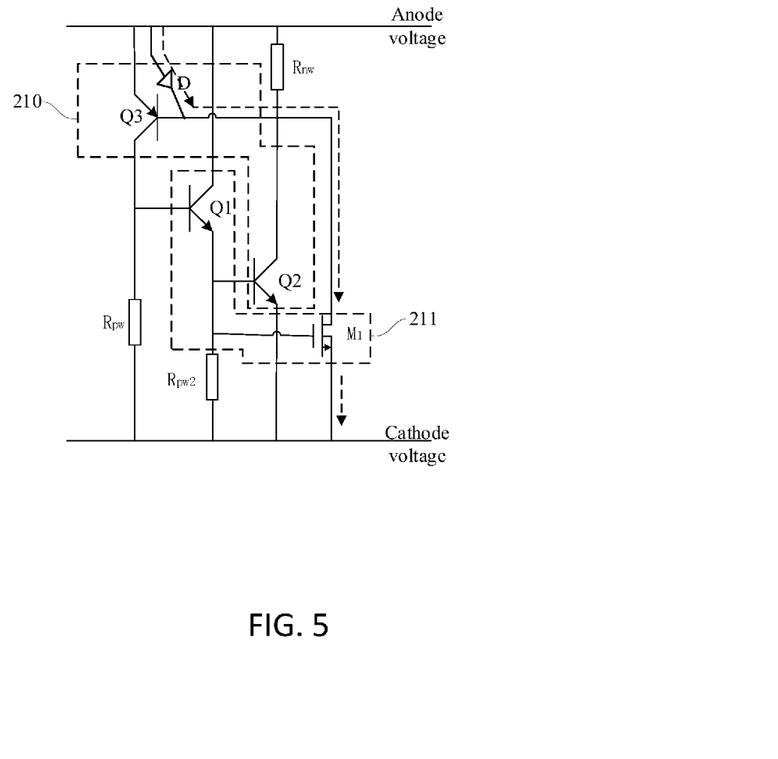

Please refer to FIGS. 3 to 5 in combination with FIG. 1. In another embodiment of the present disclosure, an electrostatic protection circuit is further provided. The SCR circuit 210 includes a first end, a second end, The third terminal, the fourth terminal and the fifth terminal; the first terminal of the SCR circuit 210 is connected to the anode voltage; the fourth terminal of the SCR circuit 210 is connected to the cathode voltage; the trigger circuit 211 includes a first three-pole transistor Q1 and a first switch transistor M1; wherein, the first transistor Q1 includes a first end, a second end and a third end, and the first switch transistor M1 includes a control end, a first end and a second end. The first end of the transistor Q1 is connected to the anode voltage, the second end of the first transistor Q1 is connected to the second end of the SCR circuit 210, and the third end of the first transistor Q1 is connected to the SCR circuit 210. The control end of the first switch transistor M1 is connected to the third end of the first transistor Q1 and the fifth end of the SCR circuit 210, and the first end of the first switch transistor M1 is connected to the SCR circuit 210. The third end of the SCR circuit 210 is connected to each other, and the second end of the first switch transistor M1 is connected to the cathode voltage.

When the ESD event comes, the first transistor Q1 in the trigger circuit 211 is first broken down and turned on to reach the cathode. Therefore, the trigger voltage becomes lower, and a voltage is generated on the base level of the SCR circuit at the same time. When the SCR path is turned on, a voltage drop is generated on the gate of the first switch transistor M1, the switch transistor is turned on, and the newly established leakage path is also opened. Therefore, the holding voltage becomes higher and the parasitic in the SCR device are weakened. The positive feedback of the transistor improves the anti-latch capability of the device, realizes a stronger protection capability, and enhances the reliability of the circuit.

As an example, as shown in FIG. 3, the SCR circuit 210 includes a second transistor Q2 and a third transistor Q3; wherein, the second transistor Q2 includes a first end, a second end and a third end, The third transistor Q3 includes a first end, a second end and a third end. The first end of the second transistor Q2 and the second end of the third transistor Q3 are short-circuited together as a SCR circuit 210. The third end of the second transistor Q2 is the fifth end of the SCR circuit 210, and the third end of the second transistor Q2 is the fourth end of the SCR circuit 210; The first end of the transistor Q3 is the first end of the SCR circuit 210, and the third end of the third transistor Q3 is the second end of the SCR circuit 210.

Specifically, taking the first conductivity type as P type and the second conductivity type as N type as an example, the first transistor Q1 is an NPN type transistor, and the collector of the first transistor Q1 is the first end, the base of the first transistor Q1 is the second end of the first transistor Q1, the emitter of the first transistor Q1 is the third end of the first transistor Q1; the second transistor Q2 Including NPN type transistor, the collector of the second transistor Q2 is the first end of the second transistor Q2, the base of the second transistor Q2 is the second end of the second transistor Q2, the second transistor The emitter of the transistor Q2 is the third end of the second transistor Q2; the third transistor includes a PNP type transistor, the emitter of the third transistor Q3 is the first end of the third transistor Q3, and the third transistor The base of the transistor Q3 is the second end of the third transistor Q3, and the collector of the third transistor Q3 is the third end of the third transistor Q3.

As an example, the first switch M1 includes an NMOS transistor, the drain of the first switch M1 is the first terminal of the first switch M1, the gate of the first switch M1 is the control terminal of the first switch M1, and the source of the transistor M1 is the second end of the first switch transistor M1.

As an example, please continue to refer to FIG. 3, the electrostatic protection circuit further includes: a first parasitic resistor Rpw, one end of the first parasitic resistor Rpw is connected to the second end of the SCR circuit 210, and the other end is connected to the cathode voltage; the second parasitic resistor Rpw Rpw2, one end of the second parasitic resistor Rpw2 is connected to the fifth end of the SCR circuit 210, the third end of the first transistor Q1 and the control end of the first switch transistor M1, and the other end is connected to the cathode voltage; the third parasitic resistor Rnw, and one end of the third parasitic resistor Rnw is connected to the first end of the first switch M1 and the third end of the SCR circuit 210, and the other end is connected to the anode voltage.

Please refer to FIG. 3, the electrostatic protection circuit further includes a bleeder circuit (not shown), the bleeder circuit includes a first switch M1 and a diode D, the first end of the first switch M1 is connected to the cathode of the diode D, and the diode. The anode of D is connected to the anode voltage. It should be noted that the diode D here is composed of the base of the third switch transistor Q3 and the drain of the first switch transistor M1.

As an example, the base of the third transistor Q3 and the drain of the first switch M1 form a diode D, the diode D and the first switch M1 form a bleeder circuit, and the anode of the diode D and the emitter of the third transistor Q3 is connected to the anode voltage, and the first end of the first switch M1 is connected to the cathode of the diode (i.e., the base of the third transistor).

Specifically, the electrostatic protection circuit in FIGS. 3 to 5 may be an equivalent circuit of the electrostatic protection structure in FIG. 1, wherein FIG. 3 is a circuit diagram of the first transistor Q1 being turned on, and FIG. 4 is a circuit diagram of a second transistor Q2 and the third transistor Q3 being turned on. FIG. 5 is the circuit diagram of the diode D and the first switch M1 being turned on. The dashed lines with the arrows in FIG. 3 to FIG. 5 indicate the directions of the currents. The well region 120 of the conductivity type, the first well region 130 of the first conductivity type and the first-doped region 131 of the second conductivity type constitute the second transistor Q2 in FIG. 3. The fourth-doped region 161, the second well region 140 of the first conductivity type and the second-doped region 141 of the second conductivity type constitute the first transistor Q1 in FIG. 3. The first-doped region 121, the well region 120 of the second conductivity type, and the first well region 130 of the first conductivity type constitute the third transistor Q3 in FIG. 3; the first gate 171, the second The third-doped region 151 of the conductivity type, the first-doped region 131 of the second conductivity type, and the first well region 130 of the first conductivity type constitute the first switch transistor M1 in FIG. 3; in FIG. 1, the first-doped region 121 of the first conductivity type and the third-doped region 151 of the second conductivity type constitute a diode.

The various embodiments in this specification are described in a progressive manner, and each embodiment focuses on the differences from other embodiments, and the same and similar parts between the various embodiments may be referred to each other.

The technical features of the above-described embodiments can be combined arbitrarily. To simplify the description, all possible combinations of the technical features of the above-described embodiments are not described. However, as long as there is no contradiction in the combination of these technical features, it should be regarded as the scope described in this specification.

The above-mentioned embodiments only represent several implementations of the embodiments of the present disclosure, and the descriptions thereof are relatively specific and detailed, but should not be construed as a limitation on the scope of the invention patent. It should be noted that for those skilled in the art, without departing from the concept of the embodiments of the present disclosure, several modifications and improvements can be made, which all belong to the protection scope of the embodiments of the present disclosure. Therefore, the protection scope of the patent of the embodiments of the present disclosure should be subject to the appended claims.

The invention claimed is:

1. An electrostatic protection structure, comprising:
a silicon controlled rectifier structure, comprising: a well region of a second conductivity type; a first well region of a first conductivity type, located adjacent to the well region of the second conductivity type; a first-doped region of the first conductivity type, located in the well region of the second conductivity type; a first-doped region of the second conductivity type, located in the first well region of the first conductivity type;
a trigger structure, comprising: the first-doped region of the second conductivity type; a second well region of the first conductivity type, located in one side of the well region of the second conductivity type away from the first well region of the first conductivity type, and adjacent to the well region of the second conductivity type; a second-doped region of the second conductivity type, located in the second well region of the first conductivity type; a third-doped region of the second conductivity type adjacent to the first-doped region of the first conductivity type and extending from the well region of the second conductivity type to the first well region of the first conductivity type; a fourth-doped region of the second conductivity type, extending from the well region of the second conductivity type to the second well region of the first conductivity type;
and a first gate, located between the third-doped region of the second conductivity type and the first doped region of the second conductivity type.

2. The electrostatic protection structure according to claim 1, further comprising a second-doped region of the first conductivity type, located in the first well region of the first conductivity type, also in one side of a third-doped region of first conductivity type away from the first gate.

3. The electrostatic protection structure of claim 1, wherein the second well region of the first conductivity type, the second-doped region of the second conductivity type, and the fourth-doped region of the second conductivity type constitutes a first transistor; and wherein the first gate, the first-doped region of the second conductivity type, the third-doped region of the second conductivity type, and the first well region of the first conductivity type constitute a first switch transistor.

4. The electrostatic protection structure according to claim 3, wherein the first-doped region of the first conductivity type and the third-doped region of the second conductivity type constitute a diode, wherein the diode is connected to the switch transistor to form a leakage path.

5. The electrostatic protection structure according to claim 1, wherein the well region of the second conductivity type, the first well region of the first conductivity type and the first-doped region of the second conductivity type constitute a second transistor; and wherein the well region of the second conductivity type, the first-doped region of the first conductivity type and the first well region of the first conductivity type constitute a third transistor.

6. The electrostatic protection structure of claim 1, further comprising: a substrate of the first conductivity type; wherein the first well region of the first conductivity type, the well region of the second conductivity type, and the second well region of the first conductivity type are all located in the substrate of the first conductivity type; and wherein the first gate is located on a surface of the substrate of the first conductivity type.

7. The electrostatic protection structure according to claim 6, further comprising a second gate, located on a surface of the substrate of the first conductivity type, between the second-doped region of the second conductivity type and the fourth-doped region of the second conductivity type; wherein the second gate, the second-doped region of the second conductivity type, the fourth-doped region of the second conductivity type, and the second well region of the first conductivity type constitutes a second switch transistor.

8. The electrostatic protection structure of claim 7, wherein the first-doped region of the first conductivity type, the well region of the second conductivity type, and the first well region of the first conductivity type constitute a PNP transistor; wherein the well region of the second conductivity type, the first well region of the first conductivity type and the first-doped region of the second conductivity type constitute a first NPN transistor; wherein the fourth-doped region of the second conductivity type, the second well region of the first conductivity type, and the second-doped region of the second conductivity type constitute a second NPN transistor; wherein the first gate, the first-doped region of the second conductivity type and the third-doped region of the second conductivity type constitute a second switch transistor; wherein the second gate, the second-doped region of the second conductivity type and the fourth-doped region of the second conductivity type constitute a second switch transistor; and wherein the first-doped region of the first conductivity type and the third-doped region of the second conductivity type constitute a diode.

9. The electrostatic protection structure of claim 1, wherein a width of the third-doped region of the second conductivity type and a width of the fourth-doped region of the second conductivity type are both twice a width of the first-doped region of the second conductivity type and twice a width of the second-doped region of the second conductivity type.

10. The electrostatic protection structure of claim 1, wherein the first conductivity type includes a P-type, and the second conductivity type includes an N-type.

11. An electrostatic protection circuit, comprising:
a SCR circuit, comprising a first node, a second end, a third end, a fourth end and a fifth end; wherein the first end of the SCR circuit is connected to an anode voltage; wherein the fourth end of the SCR circuit is connected to a cathode voltage;
a trigger circuit, comprising a first transistor and a first switch transistor; wherein, the first transistor comprises a first end, a second end and a third end; wherein the first switch transistor comprises a control end, a first end and a second end; wherein the first end of the first transistor is connected to the anode voltage, wherein the second end of the first transistor is connected to the second end of the SCR circuit, and the third end of the first transistor is connected to the fifth end of the SCR circuit; wherein the control end of the first switch transistor is connected to the third end of the first transistor and the fifth end of the SCR circuit, the first end of the first switch transistor is connected to the third end of the SCR circuit, and wherein the second end of the first switch transistor is connected to the cathode voltage.

12. The electrostatic protection circuit according to claim 11, wherein the SCR circuit comprises a second transistor and a third transistor; wherein the second transistor comprises a first end, a second end and a third end, the third transistor comprises a first end, a second end and a third end, wherein the first end of the second transistor is short-circuited with the second end of the third transistor to form together as the third end of the SCR circuit, wherein the second end of the second transistor is the fifth end of the SCR circuit, and wherein the third end of the second transistor is the fourth end of the SCR circuit; wherein the first end of the third transistor is the first end of the SCR circuit, and wherein the third end of the third transistor is the second end of the SCR circuit.

13. The electrostatic protection circuit according to claim 12, wherein a base of the third transistor and a drain of the first switch transistor form a diode, wherein the diode and the first switch transistor form a bleeder circuit, wherein an anode of the diode and the emitter of the third transistor are connected to an anode voltage, and wherein the first end of the first switch transistor is connected to a cathode of the diode.

14. The electrostatic protection circuit according to claim 12, wherein the first transistor is an NPN type transistor, wherein a collector of the first transistor is the first end of the first transistor, a base of the first transistor is the second end of the first transistor, an emitter of the first transistor is the third end of the first transistor; wherein the second transistor is an NPN type transistor, wherein a collector of the second transistor is the first end of the second transistor, and a base of the second transistor is the second end of the second transistor, an emitter of the second transistor is the third end of the second transistor; wherein the third transistor is a PNP type transistor, wherein an emitter of the third transistor is the first end of the third transistor, a base of the third transistor is the second end of the third transistor, and a collector of the third transistor is the third end of the third transistor.

15. The electrostatic protection circuit according to claim 11, wherein the first switch transistor comprises an NMOS transistor, wherein a drain of the first switch transistor is the first end of the first switch transistor, and wherein a gate of the first switch transistor is a control end of the first switch transistor, and a source of the first switch transistor is the second end of the first switch transistor.

16. The electrostatic protection circuit of claim 11, further comprising:
- a first parasitic resistor, wherein one end of the first parasitic resistor is connected to the second end of the SCR circuit, and wherein another end is connected to the cathode voltage;
- a second parasitic resistor, wherein one end of the second parasitic resistor is connected to the fifth end of the SCR circuit, the third end of the first transistor, and the control end of the first switch transistor, and wherein another end of the second parasitic resistor is connected to the cathode voltage; and
- a third parasitic resistor, wherein one end of the third parasitic resistor is connected to the first end of the first switch transistor and the third end of the SCR circuit, and wherein another end of the third parasitic resistor is connected to the anode voltage.

* * * * *